United States Patent [19]

Sakai et al.

[11] 4,195,203

[45] Mar. 25, 1980

[54] NOISE CANCELLING SYSTEM FOR FM RECEIVER

[75] Inventors: Koichi Sakai; Satoru Horie, both of Tokyo; Shinji Kitahara, Kauwasaki; Kozo Suzuki, Tokyo, all of Japan

[73] Assignee: Toko, Inc., Tokyo, Japan

[21] Appl. No.: 877,723

[22] Filed: Feb. 14, 1978

[30] Foreign Application Priority Data

Feb. 22, 1977 [JP] Japan .................................. 52-17755
Sep. 9, 1977 [JP] Japan ................................. 52-108418

[51] Int. Cl.² ............................................... H04H 5/00
[52] U.S. Cl. ................................... 179/1 GD; 455/213
[58] Field of Search ............ 179/15 BT, 1 GD, 1 GE, 179/1 GM; 325/478, 36, 402, 403

[56] References Cited

U.S. PATENT DOCUMENTS

| 3,573,382 | 4/1971 | Feit | 179/15 BT |
| 3,617,641 | 11/1971 | Feit | 179/15 BT |
| 3,739,285 | 6/1973 | Hepp | 179/15 BT |
| 3,919,482 | 11/1975 | Hamada | 179/15 BT |
| 4,066,845 | 1/1978 | Kishi | 179/15 BT |

Primary Examiner—Douglas W. Olms
Attorney, Agent, or Firm—Schwartz, Jeffery, Schwaab, Mack, Blumenthal & Koch

[57] ABSTRACT

In a noise cancelling system for FM receivers, means is provided whereby a pilot signal of 19 KHz is always detected from a stereo composite signal, whether or not a noise canceller circuit is operated. The 19 KHz pilot signal is injected into a phase locked loop, and a signal of 38 KHz in synchronism with the 19 KHz pilot signal is generated which in turn is injected into the multiplex demodulation circuit. Furthermore, means may also be provided which eliminates, from the 19 KHz pilot signal, noise mixed into the stereo composite signal and having a frequency characteristic of (19/n) KHz (n=1, 2, . . .) and then detects the foregoing pilot signal, thereby achieving satisfactory stereophonic separation.

2 Claims, 3 Drawing Figures

F I G. 2
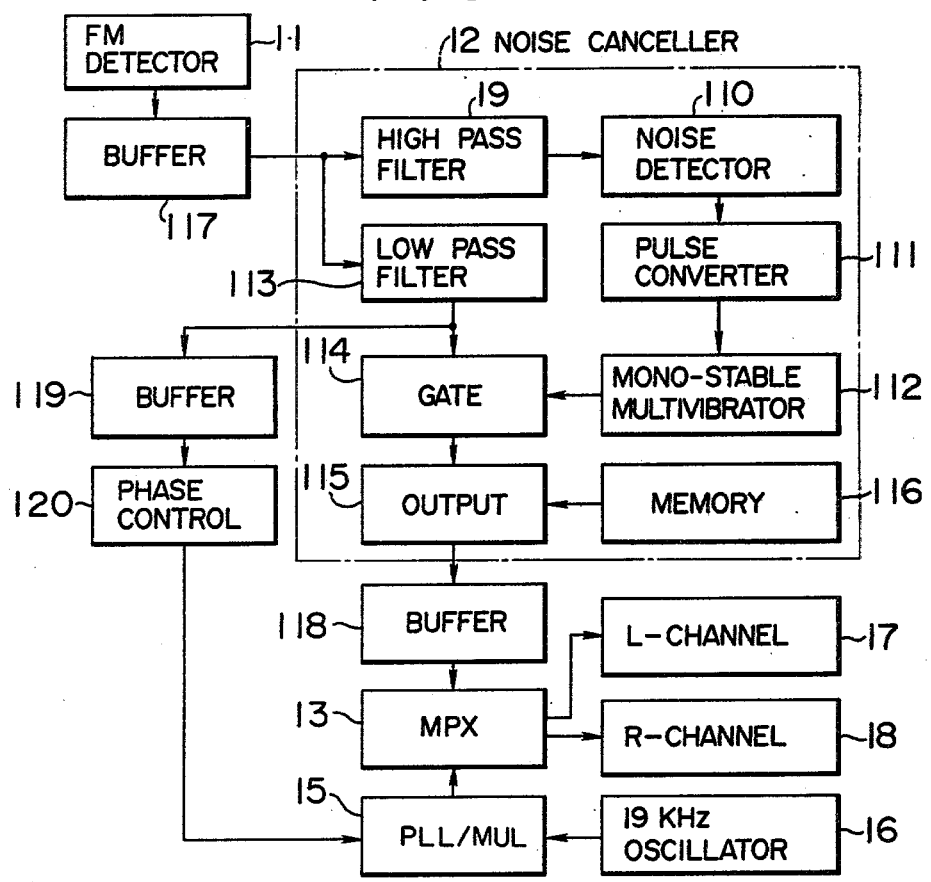

NOISE CANCELLING SYSTEM FOR FM RECEIVER

This invention relates to an improved noise cancelling system for preventing the receiving operation of an FM receiver from being disturbed by noise such as tends to be caused due to ignition or the like.

As is well known in the art, in FM broadcast, use is made of a sum signal (main channel), and a composite signal comprising a stereo sub-channel signal (23 to 53 KHz) and 19 KHz pilot signal. The 19 KHz pilot signal is converted into a signal of 38 KHz, added to the sub-channel signal and then transmitted for the purpose of making it possible to demodulate, without distortion, the separation of the L (left) and R (right) signals from the composite signal. Thus, if the 19 KHz pilot signal is interrupted by the operation of a noise cancelling circuit upon arrival of noise, this will constitute a great obstacle to the demodulation of the stereo signal. In an attempt to avoid such a problem, various systems have conventionally been proposed, but such conventional systems are not satisfactory in that difficulties are encountered which will be described in detail hereinafter.

Accordingly, it is an object of this invention to provide an improved noise cancelling system arranged to overcome the difficulties with the conventional systems.

Another object of this invention is to provide a circuit arrangement wherein even during the operation of a noise cancelling circuit, a 19 KHz pilot signal is always detected out of a stereo composite signal, and 38 KHz is injected into a multiplex demodulation circuit through a phase-locked loop.

Still another object of this invention is to provide a noise cancelling circuit including a 19 KHz pilot signal detecting circuit for cancelling pulsy noise with a frequency characteristic of $(19/n)$ KHz $(n=1, 2, \ldots)$ mixed with a stereo composite signal to thereby effect stable detection of the 19 KHz pilot signal, whereby excellent stereo separation can be achieved.

Other objects, features and advantages of this invention will become apparent from the following description taken in conjunction with the accompanying drawings.

FIG. 2 is a block diagram showing an embodiment of this invention.

Figure 1:
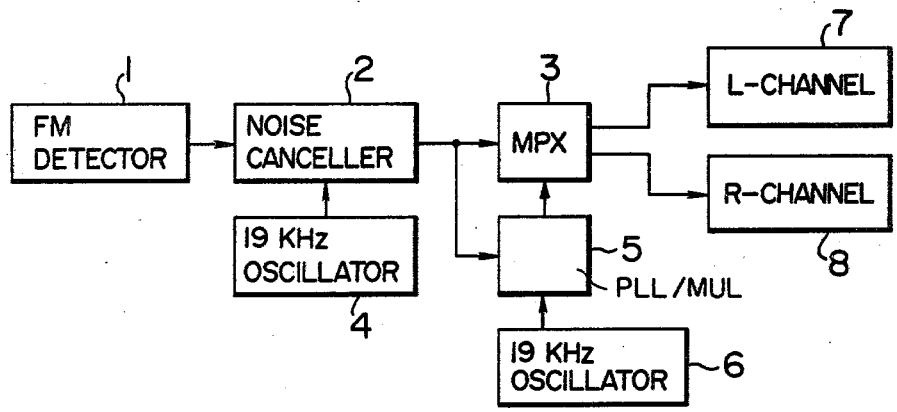
FIG. 1 is a block diagram showing the conventional noise cancelling circuit and multiplex demodulation circuit.

In order to give better understanding of this invention, description will first be made of the conventional noise cancelling circuit for FM receiver with reference to FIG. 1, which includes an FM detector circuit 1, a noise canceller circuit 2 having a 19 KHz local oscillator circuit 4, and an MPX (multiplex) demodulation circuit 3 for separating a stereo signal into an L signal 7 and R signal 8. The FM detection output is provided to a PLL (phase-locked loop) 5 through the noise canceller circuit, an oscillation derived from a 19 KHz local oscillator 6 is also injected into the PLL, and a signal of 38 KHz in synchronism with the 19 KHz pilot signal is generated which in turn is injected into the MPX demodulation circuit 3.

When the stereo signal is stably tuned, a composite signal including 19 KHz pilot signal is passed to the MPX demodulation circuit 3 through the noise canceller circuit 2, whereas once noise is introduced, then the noise canceller circuit 2 is operated so that the composite signal passed to the MPX demodulation circuit 3 is interrupted, as a result of which it becomes necessary to inject the 19 KHz signal from the local oscillator circuit 4 which is required for the purpose of demodulating the stereo signal.

Thus, it has conventionally been the common practice to employ such a circuit system that only when a gate circuit is turned off, that is, only when pulsy noise arrives, a signal of 19 KHz and a DC output equivalent to the stereo composite signal immediately before the gate circuit is turned off, are superimposed upon each other in the stereo demodulator.

In an FM receiver provided with a noise canceller circuit having the above-mentioned construction, various problems tend to arise when such a receiver incorporates, as accessory functions already in common use, the functions of AGC, AFC and automatic monaural-stereo switching and is provided with a signal intensity meter (S meter) or tuning indicator meter (T meter) which functions for convenient handling of the receiver, and with a stereo lamp (stereo indicator) indicating automatic monaural-stereo change-over. When the noise canceller circuit 2 is operated, the stereo lamp is turned off since the composite signal is interrupted and at the same time the 19 KHz pilot signal is also interrupted, and such turning on and off of the stereo lamp results in shock noise such as "pop" or the like. Moreover, even during monophonic reception, if noise is introduced into the received wave, then the noise canceller circuit will be operated so that the local oscillator circuit 4 will be caused to produce 19 KHz signal, thus resulting in a phenomenon similar to that which occurs during stereophonic reception.

In this way, the above-mentioned FM receiver is disadvantageous in that the phenomena such as described above provide an uncomfortable feeling to the operator as well as listeners.

Figure 3:
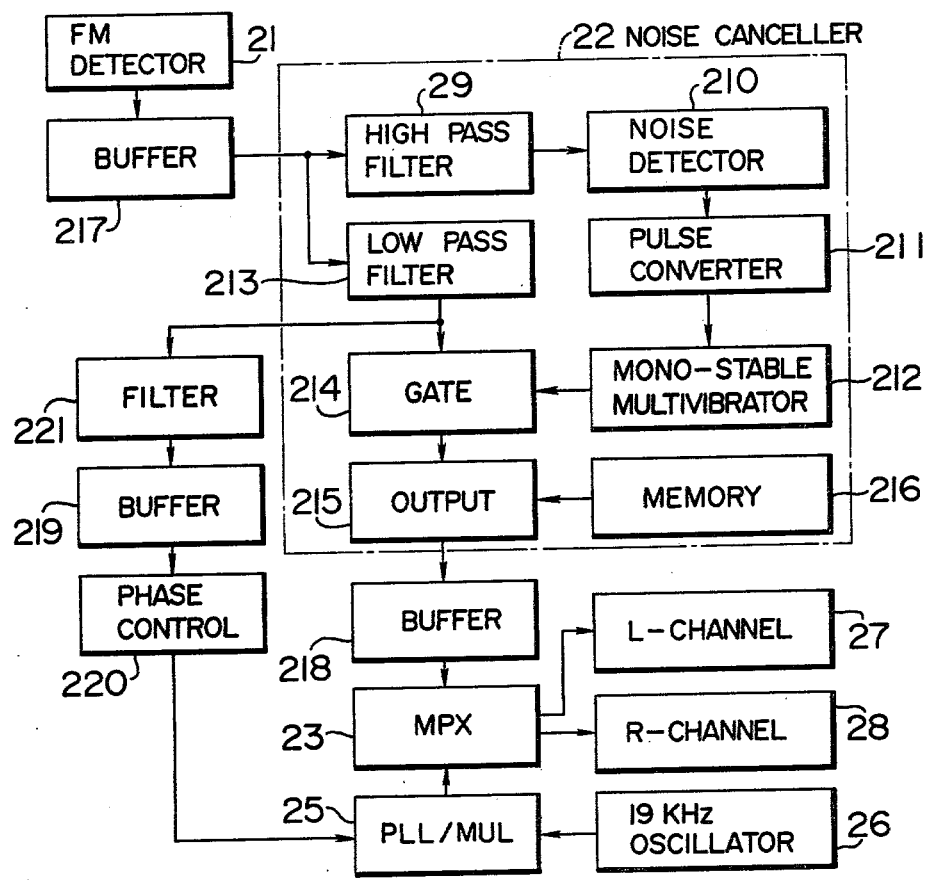
FIG. 3 is a block diagram showing another embodiment of this invention.

With reference to FIGS. 2 and 3, description will now be made of embodiments of this invention. FIG. 2 is a block diagram showing a first embodiment of this invention, wherein an FM detection output is provided through a buffer 117 to a noise canceller circuit 12 in which the FM detection output is passed through two routes, that is, through a high pass filter 19 and low pass filter 113. The high pass filter route is arranged to pass noise in the frequency band from 53 KHz to 1 MHz alone and constitutes a so-called noise detecting route, the output of which is passed to a noise detector circuit 110 comprising a differentiator circuit and thence to a pulse converter circuit 111 and mono-stable multivibrator 112, and thereafter is guided to a gate circuit 114. On the other hand, the circuit route of the low pass filter 113 is arranged to pass all components below 100 KHz including a stereo composite signal so that such components are passed to the gate circuit 114. The foregoing two circuit routes are made to extend to the gate circuit 114 as mentioned above and thus constitute logical circuits such as NAND circuits or the like. There is provided an MPX (multiplex) demodulation circuit 13 to which the output indicated at 115 of the noise canceller circuit 12 and the output of the low pass filter 113 are passed through a buffer circuit 118 and through a buffer circuit 119, phase control circuit 120 and PLL (phase-locked loop) 15 respectively. In actuality, the PLL 15 has a frequency doubler associated therewith, but in the following discussion, for the convenience of explanation, the PLL 15 will be described as including in itself the frequency doubling function.

With the prior art arrangement, as mentioned above, it is necessary to inject 19 KHz signal from the local oscillator circuit 4 when noise arrives, because the composite signal is interrupted due to the fact that the noise canceller circuit is operated. In contrast thereto, with the present arrangement illustrated in FIG. 2, there is no such necessity, as will be readily appreciated. More specifically, according to the arrangement shown in FIG. 2, in a normal tuned state, the composite signal is passed through the low pass filter circuit 113 provided in the noise canceller circuit 12 and then applied to the MPX demodulation circuit 13 through the gate circuit 114 which is then opened. At this time, composite signal including 19 KHz pilot signal available from the low pass filter circuit route is always provided to the PLL 15 through the buffer circuit 119 and phase control circuit 120. Meanwhile, a signal derived from an oscillator 16 which may comprise a crystal oscillator or the like having an oscillation frequency of 76 KHz is injected into the PLL 15, this signal is divided in terms of its frequency so that a signal of 19 KHz in synchronism with the 19 KHz pilot signal is generated and then the 19 KHz signal thus generated is doubled in terms of its frequency so that a signal of 38 KHz is generated which in turn is injected into the MPX demodulation circuit, whether the gate circuit 114 is turned on or off. Once noise such as one due to ignition or the like is mixed into the composite signal, noise in the frequency band from 53 KHz to 1 MHz is permitted to pass through the high pass filter circuit 19, and thence to the gate circuit 114 through the pulse processing circuit arrangement which comprises the noise detector circuit 110, pulse converter circuit 111 and mono-stable multivibrator 112. Simultaneously, the composite signal is passed to the gate circuit 114 through the low pass filter circuit 113. The both signals are passed to the gate circuit 114, and when a noise detection signal available from the high pass filter circuit route is applied to the gate circuit 114, this gate is turned off so that the injection of the composite signal into the MPX demodulation circuit is interrupted. Upon turning-off of the gate circuit, memory circuit 116 is actuated so that a DC output is injected into the MPX demodulation circuit 13 through the buffer circuit 118 for the purpose of making up for the interrupted segment of the composite signal. Irrespective of the fact that the gate circuit 114 is turned off, the low pass filter 113 provides 19 KHz pilot signal to the PLL 15 through the buffer circuit 119 and phase control circuit 120, so that the 19 KHz pilot signal is detected, converted into a signal of 38 KHz and then injected into the MPX demodulation circuit. In this way, according to the present embodiment of this invention, it is possible to detect the pilot signal and achieve stable separation of the stereo signal, without requiring a local oscillator such as one specially provided in the prior art arrangement.

FIG. 3 is a block diagram showing a second embodiment of this invention. The noise cancelling system according to the present embodiment also comprises a noise canceller circuit 22, a 19 KHz pilot signal detecting circuit route and a stereo demodulation circuit route, as is the case with the embodiment described above with reference to FIG. 2. The noise canceller circuit 22 comprises a pulsy noise detecting circuit, a stereo composite signal interrupting gate circuit and a memory circuit for providing a DC output immediately before the gate circuit is turned off.

The noise canceller circuit 22 will now be described in detail. In this circuit, detection output of the FM detector circuit 21 is passed to a high filter circuit 29 and low pass filter circuit 213 through a buffer circuit 217, as in the embodiment shown in FIG. 2. Moreover, the noise canceller circuit 22 comprises a circuit route for detecting pulsy noise passing through the high pass filter 29 and a circuit route for deriving a stereo composite signal through the low pass filter circuit 213, the circuit routes mentioned above being made to extend to a gate circuit 214. There is also provided a memory circuit 216 comprising a capacitance for injecting into the output stage of the gate circuit 214 a DC component which corresponds to that which occurs immediately before the gate circuit is turned off. It is of course that the noise canceller circuit 22 is by no means limited to the aforementioned arrangement and it may include the buffer circuits 218 and 219 and so forth which are required for the optimum design of the receiver. In some cases, the 19 KHz pilot signal detecting circuit and stereo demodulator are also incorporated in the noise canceller circuit.

In the 19 KHz pilot signal detecting circuit, a stereo composite signal is derived from the low pass filter circuit 213, and such a signal is passed through a filter circuit 221 which is arranged to pass the frequency of 19 KHz, so that pulsy noise of $(19/n)$ KHz is eliminated from the stereo composite signal, which in turn is passed through the buffer circuit 219 and phase control circuit 220 so as to be detected in a PLL 25. The filter circuit 221 may be constituted not only by a filter passing 19 KHz alone but also by a filter which is arranged to cut off the frequency band below 19 KHz of the stereo composite signal which has passed through the low pass filter 213. The 19 KHz pilot signal may be derived not only from the low pass filter circuit 213 but also from the buffer circuit 217; in the latter case, however, the filter circuit should have such a characteristic as to pass the frequency 19 KHz alone.

As described above, according to this invention, there is provided a circuit for detecting 19 KHz pilot signal which is provided even when the composite signal is interrupted by means of the gate circuit included in the noise canceller circuit, so that a multiplied signal of 38 KHz is always injected into the MPX demodulation circuit. Thus, it is possible to eliminate the necessity to supplement the 19 KHz by providing a special local oscillator circuit as is the case with the prior art technique, and to solve problems with the various functions of an FM receiver. More specifically, according to this invention, it is possible to avoid uncomfortable phenomena such as "pop" noise which tends to occur when monaural-stereo change-over is effected or when the stereo lamp is turned on or off or when noise arrives during monophonic reception, and so forth. Especially in the embodiment of FIG. 3, by virtue of the fact that there is provided the filter circuit 221 for the frequency of 19 KHz, it is possible to eliminate the possibility that the phase of pulsy noise is detected in the confusion with the phase of the 19 KHz pilot signal in the phase-sensitive detector constituting the PLL, when such a pulsy noise has a repetition frequency in the neighborhood of $(19/n)$ KHz (n=1, 2, ...). In other words, there is produced a difference beat signal between interference signal such as mentioned above and the 19 KHz pilot signal, whereby it is possible to prevent the stereo separation characteristic from being degraded.

It will be readily appreciated that when the 19 KHz pilot signal is derived from the buffer circuit 117 or 217, an effect similar to that which has been described above can be produced by injecting the 19 KHz pilot signal into the PLL through the use of a filter circuit which is arranged to pass the 19 KHz pilot signal alone.

As will be appreciated from what has been described above, according to the noise cancelling system embodying this invention, it is possible to effectively solve the various problems with the conventional system mentioned hereinbefore in which the 19 KHz signal is injected only when such a signal is interrupted. That is, in accordance with this invention, it is possible to avoid "pop" noise which tends to be caused when the gate circuit is turned off, turning on and off of the stereo lamp, cross modulation of the 19 KHz pilot signal serving as the reference frequency for stereo demodulation, and erroneous operation of the PLL due to pulsy noise of (19/$n$) KHz ($n=1, 2, \ldots$), thus resulting in stable separation of stereo composite signal.

Although this invention has been described with respect to some specific embodiments, it is to be understood that the invention is not restricted thereto but covers any and all modifications and changes which may be made within the scope of the appended claims.

We claim:

1. A noise-cancelling system for FM receivers wherein the output of an FM detector circuit is supplied to a multiplex demodulation circuit through a noise canceller circuit, said noise canceller circuit comprising:

a high-pass filter having an input coupled to receive the output of said FM detector circuit, and an output;

first circuit means coupled for detecting pulsive noise at said high-pass filter output and providing at an output a control signal when said pulsive noise is detected;

a low-pass filter having an input coupled to receive the output of said FM detector circuit, and an output providing a stereo composite signal;

a gate circuit having an input responsive to said control signal and an input coupled to receive said stereo composite signal, said gate circuit normally passing said stereo composite signal to said multiplex demodulation circuit and interrupting said stereo composite signal when said control signal indicates that pulsive noise is detected by said first circuit means; and storage means coupled for supplying to said multiplex demodulation circuit, during said interruption, a DC signal representative of an output of said gate circuit which is provided immediately prior to said interruption;

said noise-cancelling system further including:

second circuit means coupled for receiving said stereo composite signal from said low pass filter and deriving therefrom a 19 KHz pilot signal; and phase-locked loop and oscillator circuit means coupled for receiving said 19 KHz pilot signal and generating and supplying to said multiplex demodulation circuit and 38 KHz signal in synchronism with said 19 KHz pilot signal.

2. The apparatus of claim 1, wherein said second circuit means comprises a band pass filter for passing substantially only the 19 KHz component of said stereo composite signal, said 19 KHz component comprising said 19 KHz pilot signal.

* * * * *